United States Patent [19]

Gailus et al.

[11] Patent Number: 5,066,923
[45] Date of Patent: Nov. 19, 1991

[54] LINEAR TRANSMITTER TRAINING METHOD AND APPARATUS

[75] Inventors: Paul H. Gailus, Prospect Heights; Francis R. Yester, Arlington Heights; William J. Turney, Schaumburg, all of Ill.

[73] Assignee: Motorola, Inc., Schaumburg, Ill.

[21] Appl. No.: 606,653

[22] Filed: Oct. 31, 1990

[51] Int. Cl.$^5$ .............................................. H03F 1/36
[52] U.S. Cl. .................................. 330/107; 330/129
[58] Field of Search ................. 330/2, 75, 107, 109, 330/149, 129; 332/123, 124; 455/112, 115, 126

[56] References Cited

U.S. PATENT DOCUMENTS 4,852,090  7/1989  Borth ............................. 455/65 X
4,868,516  9/1989  Henderson et al. ............ 330/107 X Primary Examiner—Steven Mottola
Attorney, Agent, or Firm—Steven G. Parmelee

[57] ABSTRACT

A linear transmitter having both an open loop and a closed loop training mode capability functions to schedule and facilitate these training modes in a manner that reduces adjacent channel splatter. A training waveform can be utilized to enhance these operational objectives. Scheduling of the open loop and closed loop training modes can be ordered, in a TDM system, in a variety of ways.

16 Claims, 3 Drawing Sheets

LINEAR TRANSMITTER TRAINING METHOD AND APPARATUS

TECHNICAL FIELD

This invention relates generally to modulated information transmitters, including but not limited to linear transmitters operating in an RF system.

BACKGROUND OF THE INVENTION

Linear transmitters are known. A Cartesian feedback transmitter constitutes one such known transmitter. When properly adjusted, such a negative feedback based transmitter architecture will operate in a satisfactory linear mode. At least two problems plague ordinary operation of such a transmitter, however.

First, loop phase shift must be properly adjusted; if not, transmitter stability will suffer. At worst, the negative feedback operation will function in a positive mode, causing undesirable oscillation.

Second, care must be taken to ensure that the final gain stages of the transmitter do not operate at or above their clip level. If clip levels are exceeded, the negative feedback operation of the transmitter will attempt to compensate, and the undesired results will include splatter in adjacent frequencies. This splatter can greatly disturb other radio operators.

One prior art approach has been to significantly limit baseband input values in order to ensure that clip levels will not be attained. Though this will succeed in avoiding the splatter problems noted above, the necessarily arbitrary limits placed on the baseband information are ordinarily so conservative as to prevent optimum operation of the transmission capabilities of the transmitter.

Accordingly, a need exists for a method and apparatus to provide for requisite training of a linear transmitter to assure proper loop phase adjustment and optimized baseband signal levels.

SUMMARY OF THE INVENTION

These needs and others are substantially met through provision of the method and apparatus described herein. Pursuant to one aspect of the method, a training mode of operation and a non-training mode of operation are provided for a negative feedback amplifier. Phase adjustment of a feedback signal with respect to an input signal and determination of a clip level for the amplifier are determined during the training mode of operation. During the non-training mode of operation, a resultant phase adjustment setting from the training mode is utilized, and the amplifier is operated in a manner that will not exceed clip levels as determined through use of the clip level information gleaned from the training mode.

DETAILED DESCRIPTION OF THE PREFERRED EMBODIMENT

Figure 1:
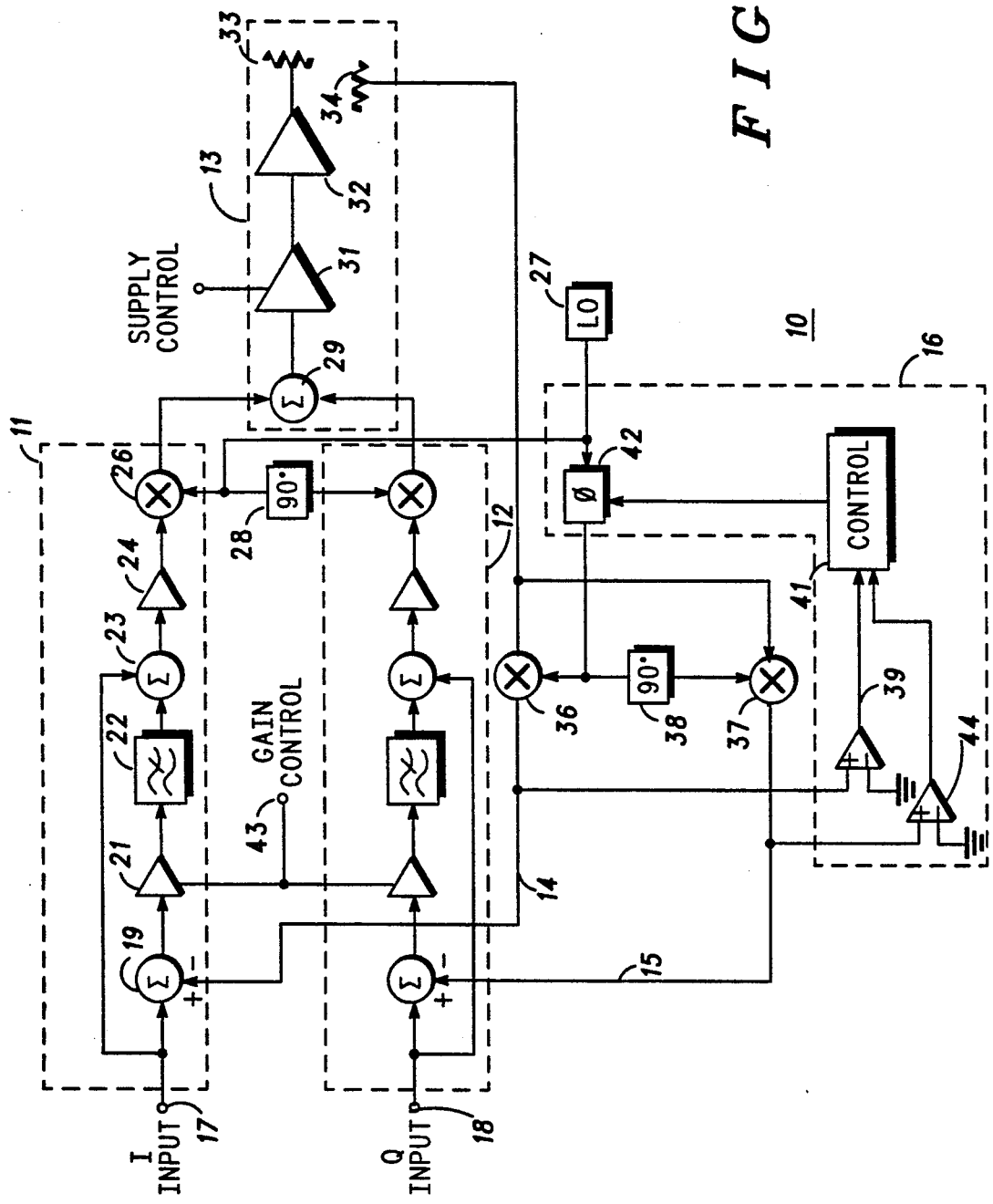
FIG. 1 comprises a block diagram depiction of a linear transmitter constructed in accordance with the invention.

Referring now to FIG. 1, a Cartesian feedback transmitter in accordance with the invention can be seen as generally depicted by the reference numeral 10. The transmitter (10) includes generally a first and second information signal path (11 and 12), a combined information signal path (13), first and second feedback paths (14 and 15), and a phase adjustment unit (16). Each of these generally referred to elements will now be described in more detail in seriatim fashion.

The first and second information signal paths (11 and 12) are identical to one another in this embodiment. They differ only in that the first path (11) receives an in-phase baseband information input signal (17) whereas the second path (12) receives a quadrature baseband information input signal. Therefore, only the first path (11) will be described in detail.

The first information path (11) couples its input (17) to a differential summer (19). The remaining input to this differential summer (19) couples to the first feedback path (14). The summer output couples to a variable gain baseband amplifier (21) that itself couples through a lowpass filter (22) to a summer (23). The remaining input to this summer (23) couples to the input (17) to support open loop operation as described below in more detail.

The output of the summer (23) passes through another amplification stage (24) to a mixer (26) that upconverts the incoming baseband signal to a predetermined carrier frequency of choice.

The injection signal for the mixer (26) is provided by a local oscillator (27), with the second information path (12) of course receiving an injection signal that has been phase shifted by 90 degrees (28).

The outputs of both information paths (11 and 12) couple to the inputs of a summer (29) that represents the input to the combined information signal path (13). The output of the summer (29) couples to the input of an exciter (31) and then through a power amplifier (32) to an appropriate output element (33).

A coupler (34) responsive to the output of the power amplifier (32) provides a feedback signal to both the first and second feedback paths (14 and 15). The up-converted signal as obtained from the PA output is first down-converted through appropriate mixers (36 and 37) and then provided to the subtractive inputs of the first and second information signal path differential summers (19) as mentioned above. The down-conversion injection signals for the feedback path mixers (36 and 37) are provided in quadrature to one another through provision of an appropriate 90 degree phase shifter (38).

The phase shift unit (16) provides comparators (39 and 44) to detect phase differences between the two inputs (17 and 18) and the two feedback paths (14 and 15), and to provide any differential information to a control unit (41) that in turn controls a phase shifter (42) that couples between the local oscillator (27) and the injection inputs for the feedback path mixers (36 and 37).

The above blocks will be generally understood by those skilled in the art. In addition, further details regarding the variable gain baseband amplifier (21) can be found in a co-pending patent application filed on even date herewith entitled "Controlled Slew Rate Amplifier," and additional information regarding the phase shift adjustment control mechanism for the feedback loops can be found in a co-pending patent application filed on even date herewith entitled "Fast Phase Shift Adjusting Method And Device For Linear Transmitter." Both of these documents are incorporated herein by this reference.

In a normal non-training mode of operation, the transmitter (10) receives its two information signals at the relevant inputs (17 and 18) and processes these signals in a known manner to correct for linearity, amplify, filter, up-convert, and combine prior to final amplification. The negative feedback paths (14 and 15) support the appropriate linearizing function.

In a training mode of operation, the transmitter (10) can be operated as follows. In an open loop mode, the variable gain baseband amplifiers (21) are disabled via a gain control signal (43), thereby effectively opening this portion of the primary paths. The incoming signals will then use exclusively the direct path to the summers (23), thereby bypassing the feedback correction point (19). In this mode, the loop phase shift can be adjusted by the phase shift adjustment unit (16). In effect, phase differences are determined by the comparators (39 and 44), and that difference information is utilized by the control unit (41) to adjust the phase shift via the phase shift unit (42). Additional information regarding this process can be found in the above referenced patent application entitled "Fast Phase Shift Adjusting Method And Device For Linear Transmitter." By making this adjustment, proper loop phase relationship can be ensured, and the feedback process will operate in a negative manner as desired, and will not inadvertently oscillate due to unintended positive feedback.

The variable gain baseband amplifiers (21) and the associated lowpass filters (22) can also be appropriately manipulated to narrow their effective bandwidth and reduce their effective slew rate, such that the transmitter (10), when operating in a closed loop mode during a training mode, can be operated with an appropriate input signal to determine the clip level for the transmitter while simultaneously substantially minimizing splatter to neighboring frequencies. Additional information regarding this process can be found both in the previously mentioned patent application entitled "Controlled Slew Rate Amplifier," and also in another co-pending patent application filed on even date herewith entitled "Amplifier Level Setting Apparatus," the latter document also being incorporated herein by this reference. Once the clip level has been ascertained pursuant to this process, training for immediate purposes can be concluded and the transmitter can be returned to normal closed loop operation with normal bandwidth and slew rate settings. The amplifier is operated near, but not exceeding, the clip level, thereby effectively gaining a high level of performance from the amplifier.

Integrating the above described training elements confronts a number of practical implementation problems. Unwanted carrier feedthrough terms can cause objectionable splatter when switching from one aspect of the training mode to another. This problem is exaggerated further because the contributors to carrier feedthrough are different between the open loop and closed loop training modes. In the open loop mode, only the forward path of the loop containing the up-mixers (26) generates carrier feedthrough terms of significance. In the closed loop mode, however, up-mixer contribution is suppressed by the forward path gain preceding it. Instead, the down-mixers (36 and 37) and associated circuits in the feedback path constitute the primary source of carrier feedthrough. The closed and open loop carrier feedthrough terms are thus substantially independent from one another and may be quite different. Therefore, a switch from open to closed loop training mode can cause significant splatter.

Figure 2:
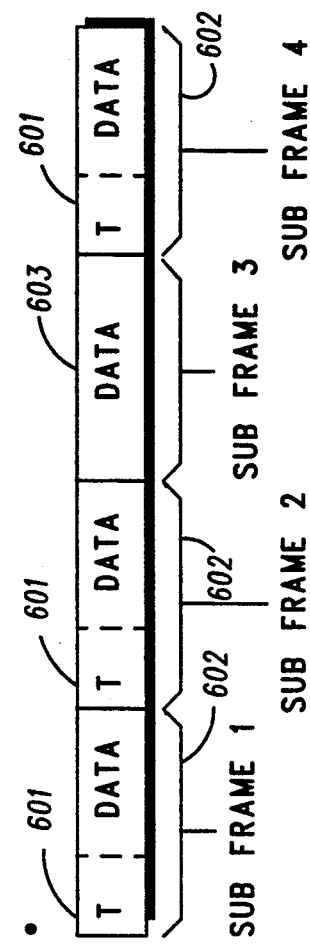
FIG. 2 comprises a simplified block diagram depicting simplified operation of a linear transmitter in accordance with the invention.

The approach adopted in this embodiment for minimizing the splatter effects are perhaps more easily understood with reference to the highly simplified feedback loop (200) illustrated in FIG. 2. As typical for a negative feedback loop, the first summer (201) produces an error signal VE representing the difference between the input signal VI and a feedback signal VF. Forward path gain includes two primary contributors; a first amplifier (202) having a first gain (A1) and a second amplifier (203) having a second gain (A2). As with the earlier described embodiment, these gain stages (202 and 203) have a summer (204) coupled therebetween, with a remaining input to the summer (204) receiving the input signal VI. By choosing $$(A2)(B) = 1$$

(A1) becomes the effective loop gain. A number of advantages result. For the large loop gains desired in closed loop operation, $$Vo \approx Vi/B.$$

On the other hand, by setting A1=0, the loop effectively opens and $$Vo = (A2)(Vi) = Vi/B.$$

Thus, the desired objective of switching between equal open and closed loop gains is achieved by selective disabling and enabling of the first gain element (202). For the simplified loop (200) depicted, $$Vo = Vi \frac{A2(1 + A1)}{1 + (A1)(A2)(B)} \approx \frac{Vi}{B}.$$

The carrier feedthrough contribution in the forward up-mix path is represented as AU, and the carrier feedthrough contribution in the feedback down-mix path is represented as AD. A smooth transition between the different carrier feedthrough signals in the open and closed loop modes occurs by implementing the first gain stage (202) with an AGC type amplifier and changing the gain control relatively slowly from zero to the represented gain A1. This substantially reduces splatter at this transition point.

Figure 3:
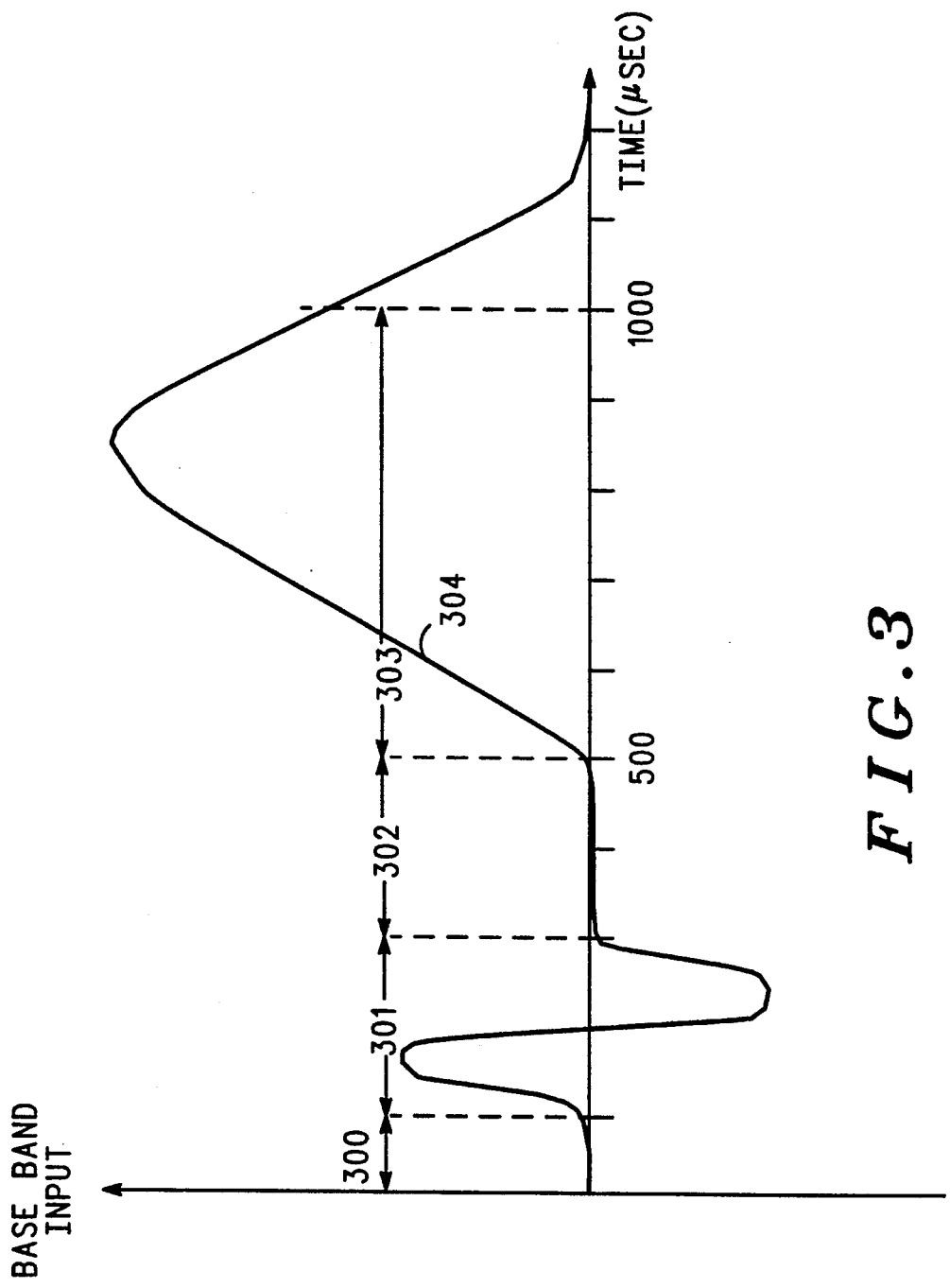
FIG. 3 comprises a timing diagram of a training waveform.

A predetermined baseband input training waveform can be utilized during the training mode to provide an appropriate signal for training purposes and to simultaneously minimize splatter opportunities, particularly when applied with the amplifier structure disclosed above. An example of a training waveform appears in FIG. 3 (the actual timing durations and relative amplitudes of different parts of the waveform can be varied considerably depending upon the actual requirements of a given system, as will be well understood by those skilled in the art). The training sequence begins (300) with an open loop initiation interval of 100 microseconds, during which sequence the supply control voltage of the exciter (31) (FIG. 1) ramps up gradually. This ramped provision of power minimizes splatter. Next, a 200 microsecond interval (301) provides an open loop phase adjustment interval during which the loop phase parameter may be adjusted as referred to above. At the conclusion of this interval (301) the phase will have been adjusted, and stability will be ensured when the loop subsequently closes.

The next 200 microsecond interval (302) provides an opportunity for a smooth transition between open and closed loop training modes via the mechanism described above. Now, in a closed loop training mode (303), the level setting procedure can be implemented to determine the relevant clip level. In this mode, the input signal (304) ramps upward from zero to its clip level during an approximate period of 400 to 500 microseconds. As described earlier, during this mode, the loop amplifier (21) functions in a low gain bandwidth and slow slew rate mode to minimize splatter when the ramp successfully attains clip. After detection and measurement of the clip level, the waveform ramps downward and subsequent information signals are appropriately scaled so as to avoid clip. The loop amplifier (21) is then set to full gain bandwidth and normal slew rate capability so that the linearizer can reduce off channel splatter when the synchronization and information signals are subsequently started. The ramp down period might typically last 200 microseconds.

Figure 4:
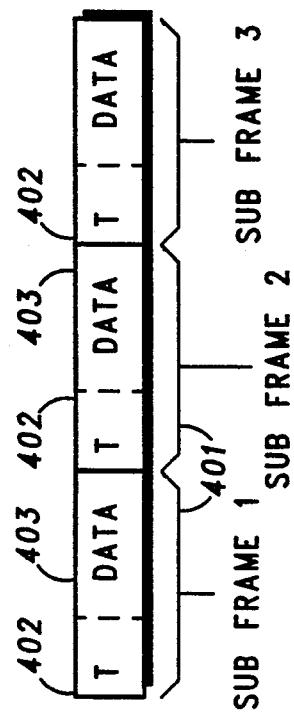
FIGS. 4, 5, and 6 depict TDM frames for various operating embodiments of a linear transmitter in accordance with the invention.

The above training sequence presumes that both open loop and closed loop training activities occur in immediate sequence, at least at the initiation of a transmission. In a TDM mode of operation, as depicted in FIG. 4, each subframe (401) can include a training segment, typically positioned at the beginning of each subframe. Each training segment (402) could then be followed by an appropriate data sequence, which could include synchronization information, encoded speech, user data, and the like.

Figure 5:
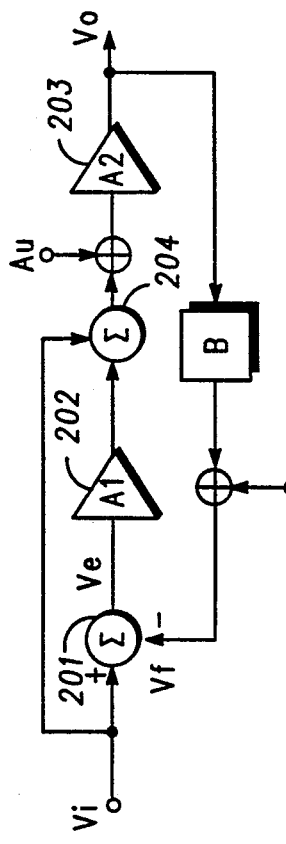

Other embodiments will of course be evident to those skilled in the art. For example, as depicted in FIG. 5, a first subframe (501) can be initiated with an open loop training segment (506). The next subframe (502) can again be initiated with a continuation of the open loop training segment (507). In a next subsequent subframe (503), the subframe may initiate with a closed loop training segment (508). Using these dispersed training segments (506, 507, and 508), more time can be utilized to accomplish the above described training, therefore yielding potentially increased accuracy in a given application. In the alternative, the timing allotment for each segment can be reduced from that described above, therefore yielding similar results with respect to accuracy, though with less time expenditure per subframe. In this particular described embodiment, once the open loop and closed loop training modes have been initially conducted, subsequent training modes (509) in subsequent subframe (504) may be combined open and closed loop training segments, wherein lessor periods of time are devoted to the training methods, based upon a presumption that the previously attained information will minimize training needs.

Figure 6:
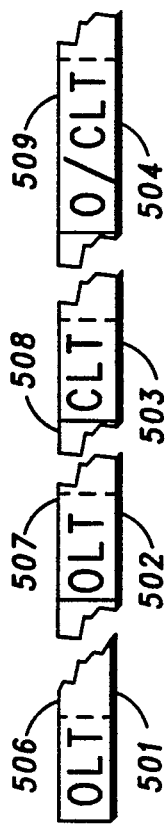

In yet another approach (FIG. 6), training segments (601) can be provided in some subframes (602), but not in others (603). This leaves increased availability in the latter (603) to accommodate additional data throughput. Training segments (601) can be skipped either according to a predetermined schedule (for example, every other subframe can include a training segment), or the training segments can be scheduled or cancelled in a dynamic manner through provision of an appropriate coded indication in the data message itself, whereby subsequent training segments can be scheduled or cancelled on an as-needed basis.

What is claimed is:

1. A method of maintaining linear operation of a negative feedback amplifier, comprising the steps of:
   A) during a first mode of operation:
      i) phase adjusting a feedback signal with respect to an input signal to provide a phase adjustment setting; and
      ii) determining a clip level for the amplifier;
   B) during a normal mode of operation:
      i) using the phase adjustment setting to assist in ensuring negative feedback operation; and
      ii) operating the amplifier at a power level not exceeding the clip level.

2. The method of claim 1 wherein the step of operating the amplifier at a power level not exceeding the clip level includes the step of operating the amplifier at a power level relatively near but not exceeding the clip level.

3. The method of claim 1, wherein the first mode of operation comprises a training mode, and the second mode of operation comprises a normal mode.

4. The method of claim 1, wherein the step of phase adjusting the feedback signal includes the steps of:
   a) phase adjusting at least two feedback signals with respect to at least two input signals, respectively, to provide the phase adjustment setting.

5. A method of maintaining linear operation of a negative feedback amplifier, comprising the steps of:
   A) during training modes of operation:
      i) at least occasionally phase adjusting a feedback signal with respect to an input signal to provide a phase adjustment setting; and
      ii) at least occasionally determining a clip level for the amplifier;
   B) during non-training modes of operation:
      i) using the phase adjustment setting to assist in ensuring negative feedback operation; and
      ii) operating the amplifier at a power level not exceeding the clip level.

6. The method of claim 5 wherein the step of operating the amplifier at a power level not exceeding the clip level includes the step of operating the amplifier at a power level relatively near but not exceeding the clip level.

7. A negative feedback amplifier, comprising:
   A) input means for receiving an input signal;
   B) feedback means for providing a feedback signal that is related to a processed version of the input signal;
   C) linearizing means operably coupled to the input means and the feedback means for processing the input signal as a function, at least in part, of the feedback signal;
   D) training means for selectively causing, during a training mode of operation:
      i) the feedback signal to be phase adjusted to provide a phase adjustment setting; and
      ii) the amplifier to be operated at a clip level with restricted bandwidth and slew rate to thereby determine the clip level;
   such that the amplifier, in a non-training mode of operation, uses the phase adjustment setting and clip level information.

8. A negative feedback amplifier, comprising:
   A) a first information signal path, including a first amplifier and filter, and a first up-conversion mixer;

B) a second information signal path, including a second amplifier and filter, and a second up-conversion mixer;

C) a combined information signal path coupled to the first and second information signal paths, and including an exciter, amplifier, and output;

D) a first feedback signal path coupled between the output and the first information signal path, and including a first down-conversion mixer;

E) a second feedback signal path coupled between the output and the second information signal path, and including a second down-conversion mixer;

F) training means for selectively causing:
  i) in an open loop training mode of operation, the first and second amplifier and filter to be effectively bypassed, and the first and second feedback signal paths to be phase adjusted; and
  ii) in a closed loop training mode of operation, the first and second amplifier and filter to be operated in a reduced bandwidth and reduced slew rate mode of operation, and clip level information for the combined information signal path to be determined.

9. The negative feedback amplifier of claim 8, wherein the training means further functions to cause the negative feedback amplifier to use the phase adjusted first and second feedback signal paths and the clip level information during at least some non-training modes of operation.

10. A method of maintaining linear operation of a linear amplifier used to source information in a TDM communication system, comprising the steps of:

A) in at least some portion of at least some TDM frames, training the linear amplifier to maintain linear operation, wherein the training includes at least the steps of:
  i) from time to time operating the linear amplifier in an open-loop training mode; and
  ii) from time to time, operating the linear amplifier in a closed-loop training mode;
B) in at least some portion of at least some TDM frames, sourcing the information.

11. The method of claim 10, wherein the step of operating the linear amplifier in an open-loop training mode includes the step of at least partially phase adjusting a feedback loop within the linear amplifier.

12. The method of claim 10, wherein the step of operating the linear amplifier in a closed-loop training mode includes the step of determining clip level information for the linear amplifier.

13. The method of claim 12, wherein the step of determining clip level information for the linear amplifier includes the step of operating the linear amplifier in a reduced bandwidth and reduced slew rate mode of operation.

14. The method of claim 11, wherein the step of operating the linear amplifier in a closed-loop training mode includes the step of determining clip level information for the linear amplifier.

15. The method of claim 14, wherein both the open-loop training mode and the closed-loop training mode occur in a same TDM frame.

16. The method of claim 14, wherein the open-loop training mode and the closed-loop training modes occur in different TDM frames.

* * * * *